US011024610B2

(12) United States Patent
Schwarz et al.

(10) Patent No.: US 11,024,610 B2
(45) Date of Patent: Jun. 1, 2021

(54) MODULE FOR A VIDEO WALL, AND METHOD OF PRODUCING SAME

(71) Applicant: OSRAM Opto Semiconductors GmbH, Regensburg (DE)

(72) Inventors: Thomas Schwarz, Regensburg (DE); Alexander Martin, Sinzing (DE); Jürgen Moosburger, Lappersdorf (DE); Karl Engl, Niedergebraching (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/318,279

(22) PCT Filed: Jul. 13, 2017

(86) PCT No.: PCT/EP2017/067764
§ 371 (c)(1),
(2) Date: Jan. 16, 2019

(87) PCT Pub. No.: WO2018/015274
PCT Pub. Date: Jan. 25, 2018

(65) Prior Publication Data
US 2019/0237443 A1    Aug. 1, 2019

(30) Foreign Application Priority Data
Jul. 18, 2016   (DE) .................... 10 2016 113 168.7

(51) Int. Cl.
*H01L 25/075* (2006.01)
*G09F 9/00* (2006.01)
*H01L 33/62* (2010.01)

(52) U.S. Cl.
CPC ............ *H01L 25/0753* (2013.01); *G09F 9/00* (2013.01); *H01L 33/62* (2013.01); *H01L 2933/0091* (2013.01)

(58) Field of Classification Search
CPC ............... H01L 25/048; H01L 25/0655; H01L 25/0753; H01L 51/50; H01L 27/32;
(Continued)

(56) References Cited

U.S. PATENT DOCUMENTS 9,368,549 B1  6/2016 Oraw et al.
2007/0216274 A1  9/2007 Schultz et al.
(Continued)

FOREIGN PATENT DOCUMENTS

DE  10 2004 025 684 A1  11/2005
DE  10 2010 047 941 A1  4/2012

*Primary Examiner* — Thanhha S Pham
(74) *Attorney, Agent, or Firm* — DLA Piper LLP (US)

(57) ABSTRACT

A module for a video wall includes a plurality of light-emitting components; and a carrier including conduction regions, wherein the light-emitting components each include a top side including a top-side contact and an underside including an underside contact, the light-emitting components are configured to emit electromagnetic radiation via the top side, the underside contacts of the light-emitting components electrically conductively connect to the conduction regions, the top-side contacts electrically contact a conductive layer, the light-emitting components each include at least four light-emitting semiconductor chips, the light-emitting semiconductor chips within a light-emitting component interconnect in parallel with one another, the light-emitting semiconductor chips within a light-emitting component each electrically conductively connect to the top-side contacts and the underside contacts of the light-emitting component, a plurality of adjacent light-emitting components constitute a cluster, and the light-emitting semi-
(Continued)

conductor chips of the light-emitting components of a cluster includes an identical nominal wavelength.

19 Claims, 10 Drawing Sheets

(58) Field of Classification Search
CPC ............. H01L 27/3211; H01L 27/3213; H01L 27/3223; F21Y 2115/15; F21Y 2105/16; F21Y 2115/20
See application file for complete search history.

(56) References Cited

U.S. PATENT DOCUMENTS

| | | |
|---|---|---|
| 2012/0146066 A1 | 6/2012 | Tischler et al. |
| 2014/0124802 A1 | 5/2014 | Do et al. |
| 2014/0226329 A1 | 8/2014 | Oraw et al. |
| 2015/0255439 A1 | 9/2015 | Kim |
| 2016/0133795 A1 | 5/2016 | Usami |
| 2017/0213502 A1* | 7/2017 | Henry ................ H01L 25/0753 |

* cited by examiner

MODULE FOR A VIDEO WALL, AND METHOD OF PRODUCING SAME

TECHNICAL FIELD

This disclosure relates to a module for a video wall, a method of producing a module for a video wall, and an operating method for a module for a video wall.

BACKGROUND

Modules for a video wall, for example, LED outdoor displays, comprise light-emitting semiconductor chips, the brightness of which is controlled such that in totality, via the light-emitting semiconductor chips, an image is displayed on the module for a video wall. This may occur, for example, monochromatically in one color or with different colors. In one example, the light-emitting semiconductor chips are positioned within light-emitting components on a carrier and are then individually drivable. In that example, the light-emitting components each contain one light-emitting semiconductor chip.

There is nonetheless a need for an improved module for a video wall and an improved method of producing such a module for a video wall.

SUMMARY

We provide a module for a video wall including a plurality of light-emitting components; and a carrier including conduction regions, wherein the light-emitting components each include a top side including a top-side contact and an underside including an underside contact, the light-emitting components are configured to emit electromagnetic radiation via the top side, the underside contacts of the light-emitting components electrically conductively connect to the conduction regions, the top-side contacts electrically contact a conductive layer, the light-emitting components each include at least four light-emitting semiconductor chips, the light-emitting semiconductor chips within a light-emitting component interconnect in parallel with one another, the light-emitting semiconductor chips within a light-emitting component each electrically conductively connect to the top-side contacts and the underside contacts of the light-emitting component, a plurality of adjacent light-emitting components constitute a cluster, and the light-emitting semiconductor chips of the light-emitting components of a cluster include an identical nominal wavelength.

We also provide a method of producing a module for a video wall including providing a carrier including conduction regions; positioning light-emitting components on the conduction regions, wherein the light-emitting components include light-emitting semiconductor chips, and the light-emitting components include an emission direction, the emission direction is oriented in the direction of a top side of the module, the light-emitting components include an underside contact on a side of the light-emitting component facing away from the top side of the module and a top-side contact on a side of the light-emitting component facing the top side of the module, and the underside contacts are in electrical contact with the conduction regions; applying a dielectric on the top side of the module, wherein the carrier, the conduction regions and the light-emitting components are covered by the dielectric, and the dielectric includes a smaller thickness than the height of the light-emitting components; applying a covering layer on the dielectric, wherein the covering layer includes a planar surface and the light-emitting components covered by the dielectric are completely covered by the covering layer; anisotropically etching the covering layer such that at least one side facing away from the carrier of the light-emitting components covered by the dielectric is uncovered; etching the dielectric in the uncovered regions such that the top-side contacts are no longer covered by the dielectric; removing the covering layer; and applying a conductive layer on the top-side contacts of the light-emitting components.

We further provide a method of operating the module for the video wall including a plurality of light-emitting components; and a carrier including conduction regions, wherein the light-emitting components each include a top side including a top-side contact and an underside including an underside contact, the light-emitting components are configured to emit electromagnetic radiation via the top side, the underside contacts of the light-emitting components electrically conductively connect to the conduction regions, the top-side contacts electrically contact a conductive layer, the light-emitting components each include at least four light-emitting semiconductor chips, the light-emitting semiconductor chips within a light-emitting component interconnect in parallel with one another, the light-emitting semiconductor chips within a light-emitting component each electrically conductively connect to the top-side contacts and the underside contacts of the light-emitting component, a plurality of adjacent light-emitting components constitute a cluster, and the light-emitting semiconductor chips of the light-emitting components of a cluster include an identical nominal wavelength, wherein a voltage and/or a current intensity of light-emitting components and/or of pixels are/is measured, the measured voltage and/or current intensity of the light-emitting components and/or pixels are/is taken as a basis to detect whether light-emitting semiconductor chips include defects, and the voltage and/or the current intensity of the light-emitting components and/or of the pixels are/is adapted in an identified defect to generate a desired light power.

LIST OF REFERENCE SIGNS

100 Module for a video wall
110 Light-emitting component
111 Underside contact
112 Top-side contact
120 Light-emitting semiconductor chip
121 Unoccupied chip position
122 Semiconductor chip with interrupted contacting
130 Carrier
140 Conduction region
141 Further conduction region
142 Transverse contact
150 Electrically conductive layer
160 Cluster
170 Pixel
171 Arrangement
172 Contacting location
173 Arrangement
180 Dielectric
190 Photoresist
210 Black layer
220 Scattering layer
221 Scattering particles

DETAILED DESCRIPTION

Our module for a video wall comprises a plurality of light-emitting components and a carrier comprising conduction regions. In this example, the conduction regions are positioned on the carrier in a manner electrically insulated from one another and serve for the electrical contacting of the light-emitting components. The light-emitting components each comprise a top side comprising a top-side contact and an underside comprising an underside contact. The light-emitting components are configured to emit electromagnetic radiation via the top side. The underside contacts of the light-emitting components electrically conductively connect to the conduction regions. The top-side contacts of the light-emitting components electrically contact to a conductive layer. The light-emitting components each comprise at least four light-emitting semiconductor chips. The light-emitting semiconductor chips within a light-emitting component interconnect in parallel with one another. Furthermore, the light-emitting semiconductor chips within a light-emitting component each electrically conductively connect to the top-side contacts and the underside contacts of the light-emitting component.

The light-emitting semiconductor chips within one of the light-emitting components may comprise an identical nominal wavelength. The radiation wavelength of the light-emitting semiconductor chips within the component lies in a wavelength range around the nominal wavelength.

By using at least four light-emitting semiconductor chips per light-emitting component, it is possible to use smaller light-emitting semiconductor chips comprising a low radiation power since, by virtue of the larger number of light-emitting semiconductor chips within the component, the light power is of just the same magnitude as if one larger light-emitting semiconductor chip had been incorporated. This first has the advantage that the heat distribution during operation of the light-emitting component and thus of the module for a video wall is better, and the operating heat may be dissipated better from the light-emitting semiconductor chips. A further advantage is that the yield of smaller light-emitting semiconductor chips is better than the light yield of larger light-emitting semiconductor chips. Furthermore, if a larger number of light-emitting semiconductor chips are present in a component, in the event of failure of an individual one of the light-emitting semiconductor chips, the brightness of the radiated light may be adapted again to the initial state by a small adaptation of the operating voltage of the light-emitting component. The more light-emitting semiconductor chips incorporated in a light-emitting component, the better this effect may be utilized. In this example, a light-emitting component may constitute a pixel.

Respectively two or three adjacent light-emitting components may constitute a pixel. The light-emitting semiconductor chips of each light-emitting component may comprise a different wavelength than the light-emitting semiconductor chips of the other light-emitting components of the same pixel. As a result, pixels comprising two or three different radiation wavelengths may be produced. Pixels comprising red, green and blue light-emitting components may be produced, in particular, which enable a color display.

In this example, a pixel is a smallest independently drivable light-emitting unit within the module, wherein within a pixel a plurality of colors may also be driven independently of one another.

A plurality of adjacent light-emitting components may constitute a cluster. The light-emitting semiconductor chips of the light-emitting components of a cluster may comprise an identical nominal wavelength. The radiation wavelength of the light-emitting semiconductor chips within a cluster lies in a wavelength range around the nominal wavelength. This enables a further increase in the number of light-emitting semiconductor chips arranged adjacent within the adjacent light-emitting components. As a result, if, for example, the luminous intensity of the module for a video wall is intended to be increased, it is possible simply to position a larger number of light-emitting components than in a module for a video wall comprising a lower luminous intensity. Prefabricated light-emitting components comprising a plurality of light-emitting semiconductor chips may thus be used to provide different modules for a video wall comprising different levels of luminous intensity. As a result, the production costs may be lowered since only a single light-emitting component is produced and provided to produce modules for a video wall comprising a varying radiation power.

Respectively two or three adjacent clusters may constitute a pixel. The light-emitting semiconductor chips of each cluster may comprise a different wavelength than the light-emitting semiconductor chips of the other clusters within the pixel. In this example, too, it is possible, with clusters of light-emitting semiconductor chips to produce and provide multicolored modules for a video wall.

The conductive layer may be configured to be transparent to a light emitted by the light-emitting semiconductor chips. As a result, the electrically conductive layer has to be structured to a lesser extent since, due to the transparency, the light of the light-emitting semiconductor chips passes through the electrically conductive layer. In particular, the entire top side of the light-emitting components may thus be covered by the electrically conductive layer. The process of producing the module for a video wall is simplified as a result.

The light-emitting components may comprise up to two thousand five hundred light-emitting semiconductor chips in a 50×50 matrix. At least one chip position within the matrix is unoccupied. This is advantageous if the light-emitting semiconductor chips comprise different radiation characteristics of their emission due to the process of producing the light-emitting semiconductor chips. By testing and preselecting the light-emitting semiconductor chips and subsequently arranging up to two thousand five hundred light-emitting semiconductor chips in a 50×50 matrix in which one or a plurality of chip positions are unoccupied, it is possible to produce light-emitting components that each comprise an identical radiation power. The light-emitting semiconductor chips incorporated in the light-emitting components may thus be selected such that, for the same applied voltage and the same applied current intensity, each of the light-emitting components comprises an identical brightness of the emitted light. These components comprising an identical brightness then enable simpler driving of the light-emitting components within the module for a video wall since an identical voltage and current intensity are required for all light-emitting components.

The light-emitting components may comprise up to two thousand five hundred light-emitting semiconductor chips in an m×n matrix. An electrical contacting of at least one light-emitting semiconductor chip of the matrix may be interrupted. As a result, it is likewise possible to produce light-emitting components comprising an identical radiation characteristic given the presence of a predefined current and a predefined voltage by virtue of the fact that, instead of omitting individual chip positions, the light-emitting semiconductor chips are indeed positioned at individual chip positions within the light-emitting component, but then not contacted, or a contacting possibly present is interrupted. Light-emitting components comprising an identical radiation characteristic may in turn advantageously be produced as a result.

An insulation layer may be provided between the conduction regions and the electrically conductive layers and brings about an insulation of the conduction regions and the electrically conductive layers with respect to one another.

Scattering particles may be provided on the top side of the light-emitting components to improve the optical properties of the module.

The electrically conductive layer may electrically conductively connect by a contacting location to an underside of the carrier facing away from the light-emitting components. The conduction regions electrically conductively connect to the underside of the carrier by a contacting location. As a result, it is possible to provide a module for a video wall that may be electrically contacted from the underside.

A method of producing a module for a video wall comprises:

Providing a carrier comprising conduction regions.

Positioning light-emitting components on the conduction regions, wherein the light-emitting components comprise light-emitting semiconductor chips. The light-emitting components comprise an emission direction, wherein the emission direction is oriented in the direction of a top side of the module. Furthermore, the light-emitting components comprise an underside contact arranged on a side of the component facing away from the top side of the module and electrically conductively connects to the conduction region. In addition, the components comprise a top-side contact facing the top side of the module.

Applying a dielectric on the top side of the module, wherein the carrier, the conduction regions and the light-emitting components are covered by the dielectric, and wherein the dielectric comprises a smaller thickness than the height of the light-emitting components.

Applying a covering layer on the dielectric, wherein the covering layer comprises a planar surface and the light-emitting components covered by the dielectric are completely covered by the covering layer.

Anisotropically etching the covering layer such that at least one side, facing away from the carrier, of the light-emitting components covered by the dielectric is uncovered.

Etching the dielectric in the uncovered regions such that the top-side contacts of the light-emitting components are no longer covered by the dielectric.

Removing the covering layer.

Applying a conductive layer on the top-side contacts of the light-emitting components.

With this method, in particular by anisotropically etching the photoresist such that the side facing away from the carrier of the light-emitting components covered by the dielectric is uncovered, it is not necessary for the photoresist to be patterned by exposure to uncover the top sides of the light-emitting components. For this reason, it is unimportant if, during the process of positioning the light-emitting components, the latter are not positioned at an optimum position, but rather in a manner offset slightly from the optimum position. By anisotropically etching the photoresist, the light-emitting components together with the dielectric at the top side are uncovered independently of positioning errors, as a result of which a simplified production process is made possible.

The module for a video wall may be produced by this method.

The covering layer may comprise a photoresist. In the method, the photoresist may additionally be patterned by exposure and etching. This is carried out in particular in the regions in which no light-emitting components are positioned. As a result, it is possible both to implement an additional structure of the photoresist and uncover the dielectric below the photoresist in regions other than those in which the light-emitting components are positioned.

The conduction regions may be provided with a metallic coating before the light-emitting components are positioned on the conduction regions. This may be carried out in particular to simplify electrical contacting between the conduction regions and the light-emitting components, or to apply a thin layer of solderable material on the conduction region. By way of example, a conduction region comprising copper may be covered with a nickel layer and a silver layer, for example, by a galvanic method.

The top side of the module outside the components may be covered with a black layer. This is advantageous to achieve a black appearance of the module for a video wall.

A scattering layer may be applied on the top side of the module for a video wall. The optical properties of the module for a video wall produced in this way may be improved as a result.

In a method of operating a module for a video wall, a voltage and/or a current intensity of light-emitting components and/or of pixels within the module for a video wall are/is measured. The measured voltage and/or current intensity of the light-emitting components and/or pixels are/is taken as a basis of detecting whether light-emitting semiconductor chips comprise defects. If one or more light-emitting semiconductor chips comprise an identified defect, the voltage and/or the current intensity of the light-emitting components and/or of the pixels are/is adapted to generate a desired light power. As a result, in a defect involving failure of individual light-emitting semiconductor chips of a light-emitting component, the total voltage and total current intensity of the light-emitting components or of the pixel comprising the light-emitting components are adapted such that the radiated power of the light-emitting component or of the pixel once again corresponds to a setpoint value.

The above-described properties, features and advantages and the way in which they are achieved will become clearer and more clearly understood in association with the following description of examples explained in greater detail in association with the drawings.

Figure 1:
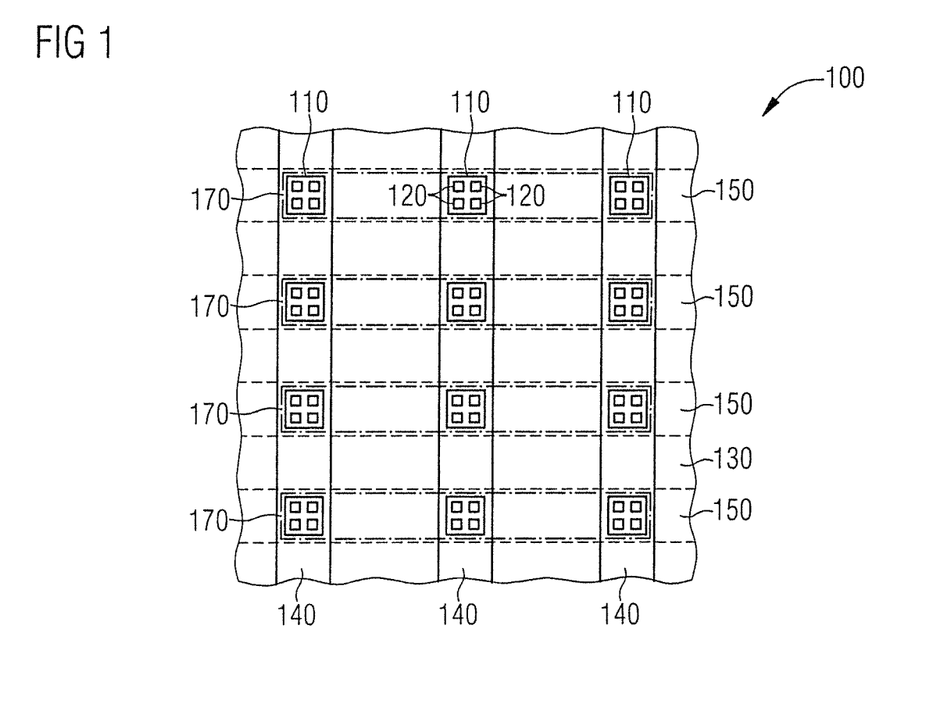
FIG. 1 schematically shows an excerpt form a module for a video wall.

FIG. 1 shows a plan view of an excerpt from a module 100 for a video wall. Light-emitting components 110, each comprising four light-emitting semiconductor chips 120, are arranged on conduction regions 140 of a carrier 130. The conduction regions 140 conduct electric current and may be configured, for example, as conductor tracks on the carrier 130. Copper may be provided as material for the conduction regions 140. Furthermore, the conduction regions 140 may be coated with nickel and/or silver. The carrier 130 may, for example, be a circuit board or comprise a circuit board material. The conduction regions 140 each comprise a plurality of light-emitting components 110. The light-emitting components 110 comprise an underside contact on the underside and bear with the underside contact directly on the conduction regions 140. On a top side opposite the underside, the light-emitting components 110 comprise a top-side contact. The light-emitting components 110 are configured to emit electromagnetic radiation via the top side. The light-emitting semiconductor chips 120 within the light-emitting components 110 each interconnect in parallel with one another and electrically conductively connect to the underside contact on the underside of the light-emitting component 110 and the top-side contact on the top side of the light-emitting component 110. A plurality of electrically conductive layers 150 are illustrated by dashed lines, wherein the electrically conductive layers 150 are arranged perpendicular to the conduction regions 140. As a result, the light-emitting components 110 electrically conductively connect both to a conduction region 140 and an electrically conductive layer 150.

The mutually perpendicular arrangement of conduction regions 140 and electrically conductive layers 150 makes it possible to individually drive the light-emitting components 110 by applying a voltage respectively between a conduction region 140 and an electrically conductive layer 150. By a correspondingly electrical circuit that controls the voltage, or the current intensity, present at a light-emitting component 110, the light-emitting components 110 may each comprise a mutually different radiation power and thus represent an image on the module 100 for a video wall. The excerpt from the module 100 for a video wall illustrated in FIG. 1 thus reproduces only a small region of the module 100 for a video wall. The number of light-emitting components 110 of the module 100 for a video wall may be greater than one million.

The conduction regions 140 and electrically conductive layers 150 may also be at a different angle with respect to one another.

In one example, respectively two or three adjacent light-emitting components 110 constitute a pixel of the module 100. In this example, pixels are the smallest individually drivable unit that generate a rasterized image by the module 100 for a video wall. By way of example, three light-emitting components 110 arranged horizontally next to one another and electrically conductively connect to one of the electrically conductive layers 150 may constitute a pixel. It is likewise possible for three light-emitting components 110 arranged vertically one above another and positioned on one of the vertically arranged conduction regions 140 to constitute the pixel. FIG. 1 illustrates the example in which three light-emitting components 110 arranged horizontally next to one another constitute a respective pixel 170. The semiconductor chips 120 of each light-emitting component 110 comprise a different wavelength than the light-emitting semiconductor chips of the other light-emitting components 110 within the pixel 170. In a pixel 170 in FIG. 1, therefore, for example, the light-emitting component 110 arranged on the far left may comprise a blue wavelength, while the light-emitting component 110 arranged in the middle may comprise a green wavelength and the light-emitting component 110 arranged on the far right may comprise a red wavelength and an RGB display is thus made possible.

Figure 2:
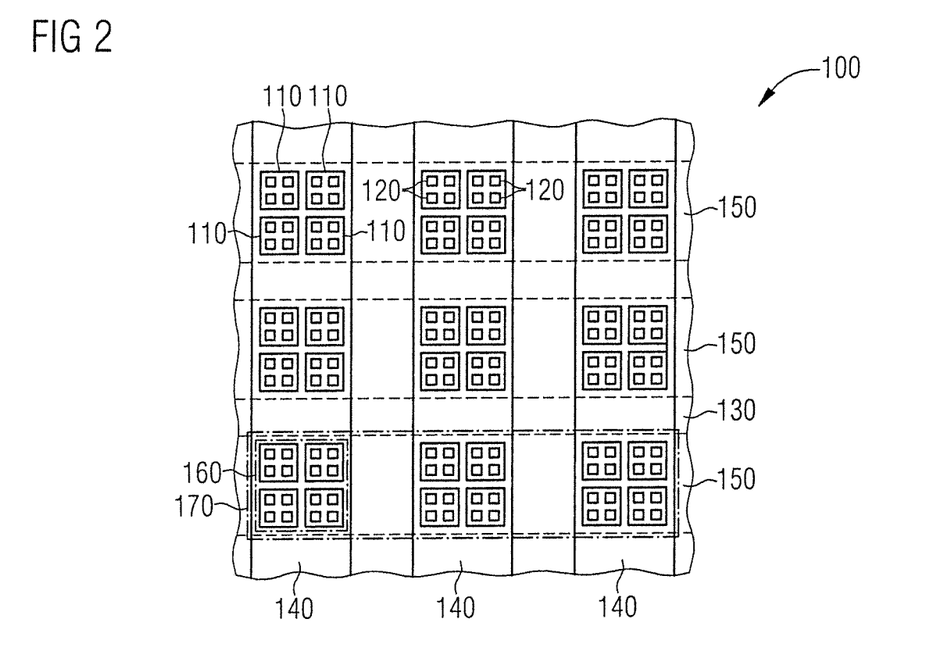
FIG. 2 schematically a further excerpt from a module for a video wall.

FIG. 2 shows a further plan view of an excerpt from a module 100 for a video wall in which, in contrast to FIG. 1, rather than one light-emitting component 110, four light-emitting components 110 are positioned at each crossover point between a conduction region 140 and an electrically conductive layer 150, wherein the four light-emitting components 110 constitute a cluster 160. Each of the light-emitting components 110 in turn comprises four light-emitting semiconductor chips 120. Provision may thus be made for a plurality of light-emitting component 110 to be provided at a crossover point of conduction region 140 and electrically conductive layer 150, which light-emitting components may be contacted identically by the conduction region 140 and the electrically conductive layer 150. As a result, a desired radiation power of the module 100 for a video wall may be increased without altering the composition of the light-emitting components 110, since simply a larger number of light-emitting components 110 is used.

In the example in FIG. 2, respectively two or three adjacent clusters 160 may once again constitute a pixel 170, analogously to the pixel 170 in FIG. 1. This may be carried out both horizontally and vertically, analogously to FIG. 1, wherein the pixel 170 depicted in FIG. 2 is arranged horizontally. The light-emitting semiconductor chips 120 of the light-emitting components 110 within a cluster 160 in this example comprise an identical wavelength, while the further light-emitting semiconductor chips 120 within the light-emitting components 110 of the further clusters 160 comprise a wavelength different from the wavelength. This in turn makes it possible to produce an RGB display if one cluster 160 of the pixel 170 radiates blue, one cluster 160 radiates red and one cluster 160 radiates green.

In the examples shown in FIGS. 1 and 2, the electrically conductive layer 150 is configured to be transparent to a light emitted by the light-emitting semiconductor chips 120. In the examples in FIGS. 1 and 2, the electrically conductive layer 150 covers the light-emitting components 110, in particular the top-side contact of the light-emitting components 110.

One example provides for the electrically conductive layer 150 to be nontransparent. In this example, the electrically conductive layer 150 at least partly does not cover the light-emitting components 110 so that the emission of the light of the light-emitting semiconductor chips 120 is possible. For this purpose, the light-emitting components 110 might comprise, for example, a top-side contact in a corner. The electrically conductive layer 150 then electrically conductively connects only to this corner contact, without covering the rest of the light-emitting components 110.

Figure 3:
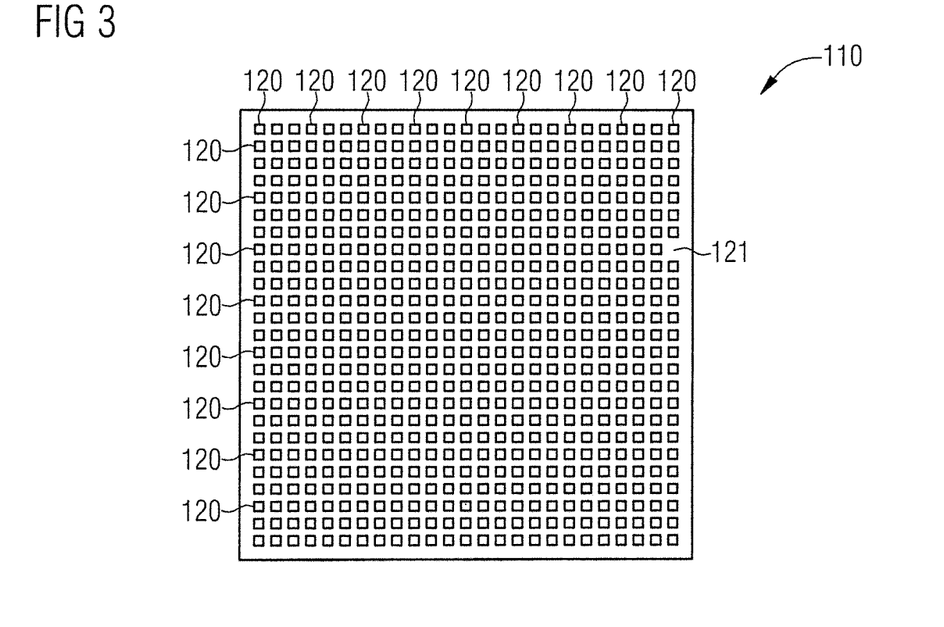
FIG. 3 schematically shows the construction of a light-emitting component.

FIG. 3 shows the plan view of a light-emitting component 110 comprising a 25×25 matrix of light-emitting semiconductor chips 120. The light-emitting component 110 thus comprises up to six hundred and twenty-five light-emitting semiconductor chips 120 arranged in a grid of 25×25 light-emitting semiconductor chips. No light-emitting semiconductor chip is provided at one unoccupied chip position 121 within the 25×25 matrix. Within the 25×25 matrix it is also possible for as many chip positions as desired to remain unoccupied, such that in particular light-emitting components 110 comprising an arrangement of 20×20 or some other arrangement of light-emitting semiconductor chips 120 are also made possible. Provision may likewise be made for the light-emitting semiconductor chips 120 to be arranged linearly within a light-emitting component 110, for example, four linearly arranged light-emitting semiconductor chips 120 within a light-emitting component 110. Moreover, the light-emitting component 110 may also comprise a larger number of light-emitting semiconductor chips 120, for example, up to two thousand five hundred light-emitting semiconductor chips 120 in a 50×50 matrix.

By leaving individual chip positions unoccupied and thereby providing unoccupied chip positions 121, it is possible to adapt the radiation power of the light-emitting components 110 to measured radiation characteristics of the light-emitting semiconductor chips 120. This may be advantageous in particular if the light-emitting semiconductor chips comprise a mutually different radiation characteristic on account of the production process. The light-emitting semiconductor chips 120 may then be selected such that the radiation power of a light-emitting component 110 reaches a predefined setpoint value as closely as possible. A plurality of such light-emitting components may then be provided for the module 100 for a video wall.

Figure 4:
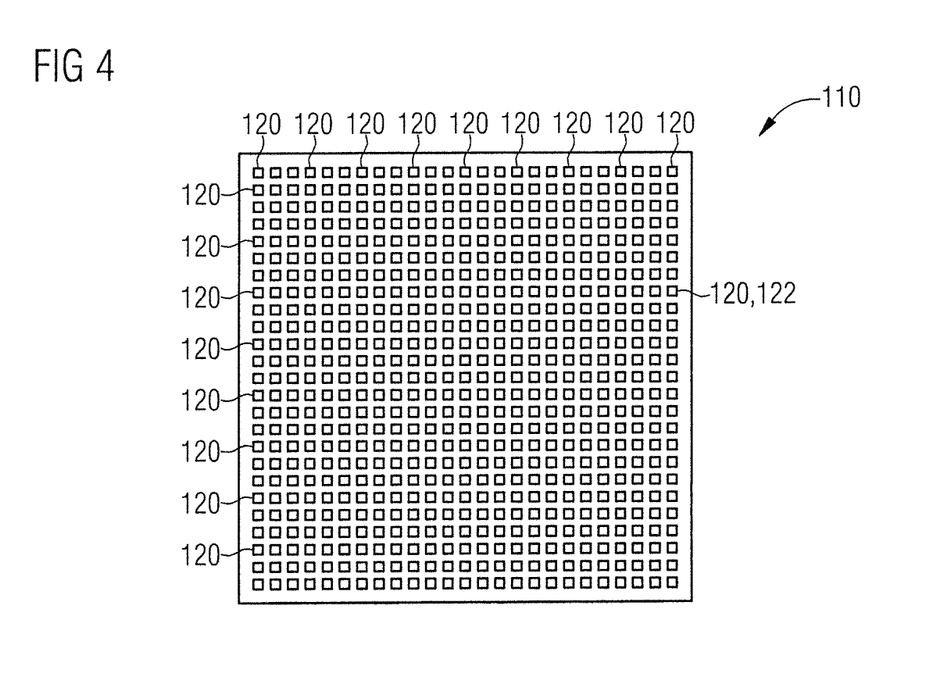
FIG. 4 schematically shows the construction of a further light-emitting component.

FIG. 4 shows a light-emitting component 110 comprising a 25×25 matrix of light-emitting semiconductor chips 120. However, a larger or smaller number of light-emitting semiconductor chips 120 may also be provided. One semiconductor chip 122 comprises an interrupted contacting. This semiconductor chip 122 comprising interrupted contacting is, for example, not electrically conductively connected to the top-side contact of the light-emitting component 110. In this example, interrupting the contacting of the semiconductor chip 122 corresponds to omitting the semiconductor chip in FIG. 3, that is to say the unoccupied chip position. By interrupting the contacting of the semiconductor chip 122, it is possible in turn to adapt the radiation power of the light-emitting component 110.

This light-emitting component 110, too, may comprise a larger number of light-emitting semiconductor chips 120, for example, up to two thousand five hundred light-emitting semiconductor chips 120 in a 50×50 matrix. Furthermore, it is possible also to provide an m×n matrix, thus resulting in a rectangular arrangement of the semiconductor chips 120 in contrast to the square arrangement illustrated in FIG. 4. Such a rectangular arrangement is likewise possible for the example in FIG. 3.

Both omitting a chip position in FIG. 3 and interrupting the contacting of a light-emitting semiconductor chip 120 in FIG. 4 thus make it possible to adapt the light power of the light-emitting component 110 to the light-emitting semiconductor chips and the production variation thereof.

In this example, the light-emitting semiconductor chips 120 of the light-emitting components 110 in FIGS. 3 and 4 are arranged at a distance from one another, wherein the distance is of the order of magnitude of dimensions of the light-emitting semiconductor chips 120. It is likewise possible for the light-emitting semiconductor chips 120 of the light-emitting components 110 in FIGS. 3 and 4 to be arranged at a small or even no distance from one another. The light-emitting semiconductor chips 120 may be, for example, square with a side length of 4 to 6 micrometers, while the distance between the light-emitting semiconductor chips is between 0 and 15 micrometers.

Figure 5:
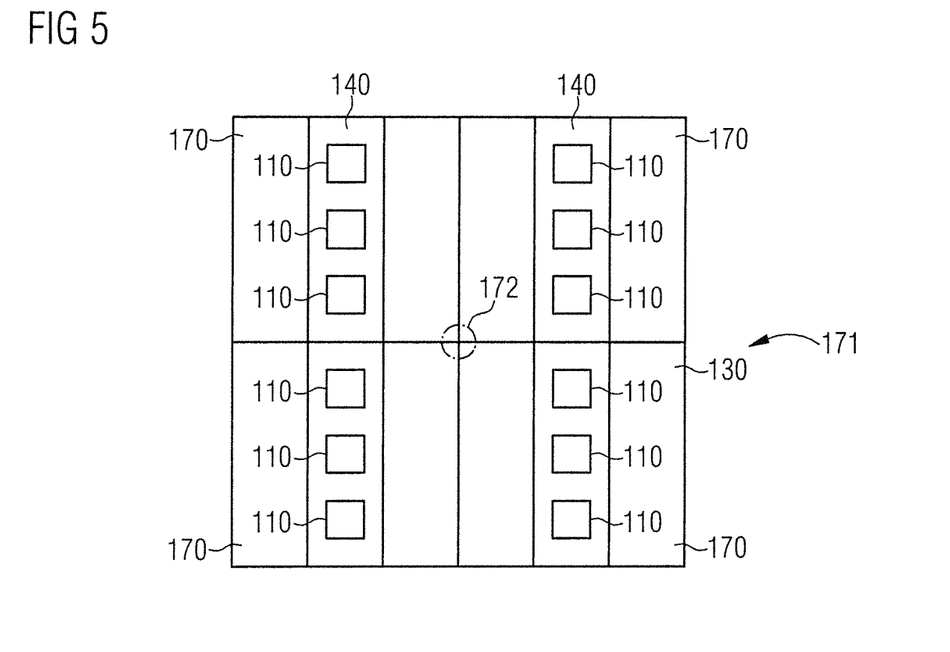
FIG. 5 schematically shows an arrangement of four pixels comprising light-emitting components.

FIG. 5 shows an arrangement 171 of four pixels 170. In this example, the four pixels 170 are present in a 2×2 arrangement. Within the arrangement 171 of the four pixels 170, two conduction regions 140 extend vertically on a carrier 130. Within a pixel 170, each of the conduction regions 140 comprises three light-emitting components 110. The light-emitting components 110 may each electrically conductively connect to one another in the horizontal direction by an electrically conductive layer, which is not illustrated in FIG. 5. This results in six horizontally arranged electrically conductive layers electrically insulated from one another. A contacting location 172 in the center of the arrangement 171 of the four pixels 170 may serve for the electrical contacting of the arrangement 171 of pixels 170. In this example, the contacting location 172 may electrically conductively connect to the left-hand one of the two conduction regions 140, to the right-hand one of the two conduction regions 140 or to one of the six horizontally arranged electrically conductive layers. The contacting location 172 is electrically insulated from the respective other seven electrically conductive regions, that is to say the remaining conduction regions 140 and electrically conductive layers.

Figure 6:
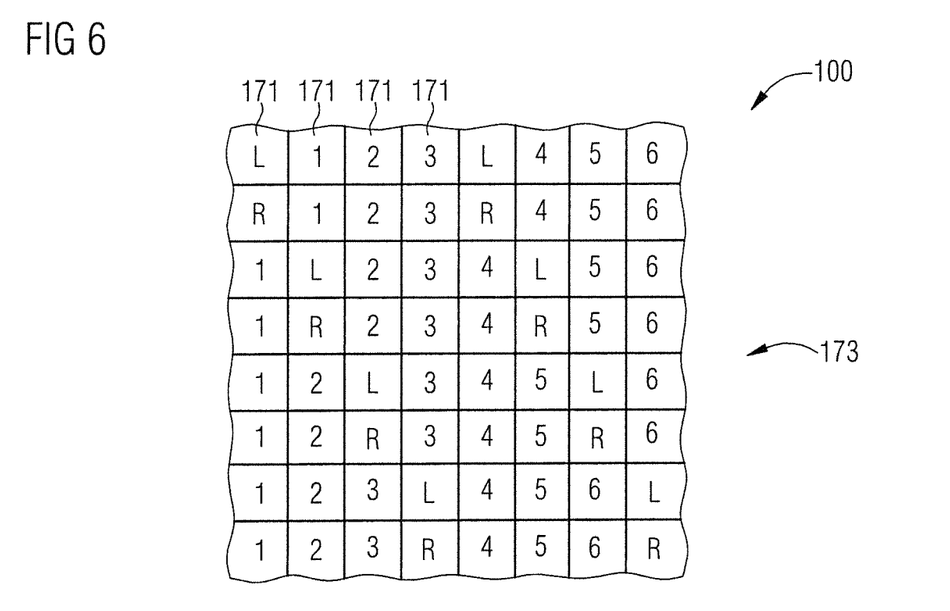
FIG. 6 schematically shows a contacting example for a module for a video wall.

FIG. 6 shows an excerpt from a module 100 for a video wall in which a total of sixty-four of the arrangements 171 from FIG. 5 are arranged in an 8×8 grid. Within a column of the arrangement extending vertically downward, the conduction regions 140 in this example electrically conductively connect to one another. Within a horizontally extending column of the arrangements 171, the electrically conductive layers electrically conductively connect to one another. In the individual arrangements 171, letters and numerals respectively indicate which electrically conductive region of the arrangement 171 electrically conductively connects to the contacting location 172. In this example, the letter L refers to the left-hand one of the two conduction regions 140, and the letter R to the right-hand one of the two conduction regions 140. The numerals 1 to 6 refer to the electrically conductive layers consecutively numbered from top to bottom, which extend horizontally. In each vertical column of the arrangement 173 in FIG. 6, contacting the two vertically extending conduction regions 140 is indicated by both an L and an R. In each row of the arrangement 173, the contacting of one of the six horizontally extending electrically conductive layers is indicated by a numeral between 1 and 6. As a result, all the light-emitting components 110 are drivable via two contacting locations 172, wherein one of the two contacting locations 172 connects to a conduction region 140 and one of the two contacting locations 172 connects to an electrically conductive layer. By applying an electrical voltage to the contacting location 172 of one of the arrangements 171 in which an electrical contacting of the conduction regions 140 is indicated by a letter and an arrangement 171 in which an electrically conductive connection between the contacting location 172 and a horizontal electrically conductive layer is indicated by a numeral, it is thus possible for a light-emitting component 110 of exactly one pixel 170 to be selected and driven. By a corresponding control, therefore, brightness values of all the light-emitting components 110 of all the pixels 170 may be controlled by an electrical voltage being applied between a respective one of the vertical conduction regions 140 and a respective one of the horizontal electrically conductive layers 150. A plurality of the arrangements 173 illustrated in FIG. 6 may jointly constitute the module 100 for a video wall. In this example, the arrangement 173 shown in FIG. 6 contains two hundred and fifty-six pixels comprising a total of seven hundred and sixty-eight different driving possibilities.

It is likewise possible to use, instead of one light-emitting component 110, a cluster 160 of light-emitting components 110 analogously to FIG. 2 for a pixel 170 in FIGS. 5 and 6.

Scattering particles may be arranged on the top side of the light-emitting components 110 facing the observer in FIGS. 1 to 6. In one example, a black layer is arranged on the top side of the carrier 130 facing the observer in FIGS. 1 to 6.

The light-emitting components 110 may electrically conductively connect to one another row by row via the underside contacts and conduction regions 140 and connect to one another column by column via the top-side contacts and the conductive layers 150. Alternatively, the light-emitting components 110 may electrically conductively connect to one another column by column via the underside contacts and conduction regions 140 and the light-emitting components 110 connect to one another row by row via the top-side contacts and the conductive layer 150.

A respective insulation layer may be provided between the conduction regions 140 and a plurality of transparent conductive layers 150.

Figure 7:
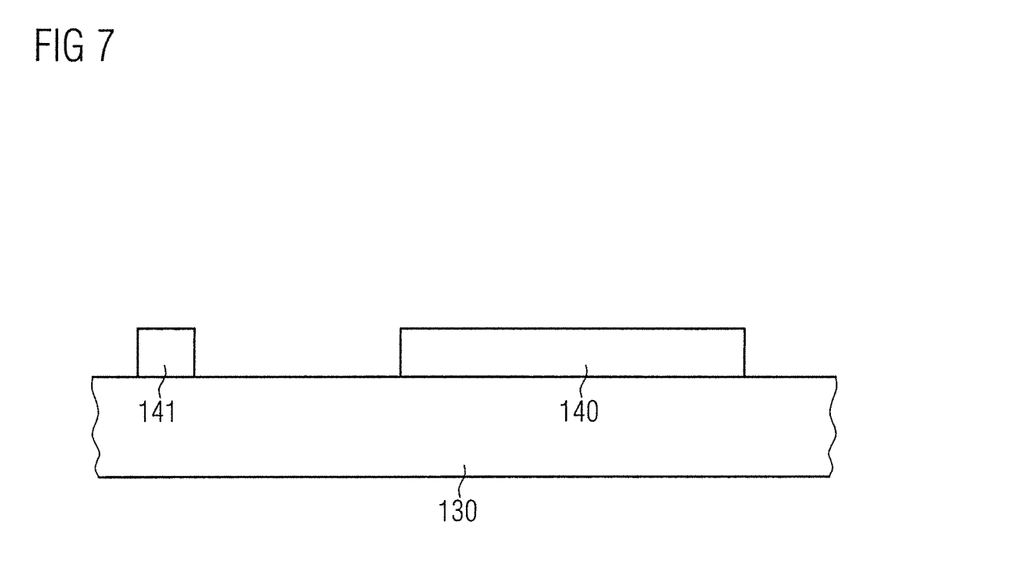
FIGS. 7 to 15 schematically show cross sections through partial regions of a module for a video wall during a production process.

FIGS. 7 to 15 then each show in cross section a sequence of a method of producing a module for a video wall. In FIG. 7, a carrier 130 comprising a conduction region 140 and a further conduction region 141 is provided for this purpose. In this case, the conduction region 140 and the further conduction region 141 are arranged on the same side of the carrier 130. In this example, the carrier 130 may be a circuit board comprising circuit board material, for example, FR4. The conduction regions 140, 141 may comprise a conductive material, for example, copper or gold. In this example, the conduction regions may comprise a thickness of approximately 12 micrometers.

Figure 8:
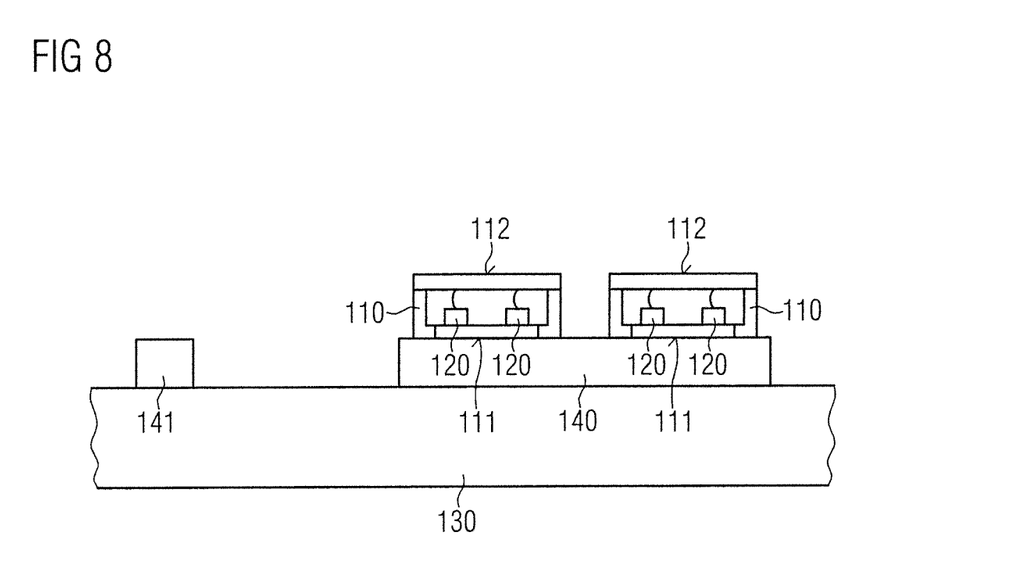

In FIG. 8, two light-emitting components 110 are positioned on the conduction region 140. In this example, the light-emitting components 110 each comprise a plurality of light-emitting semiconductor chips 120. However, it is also possible for a light-emitting component 110 to contain only one light-emitting semiconductor chip 120. In this example, an underside contact 111 of the light-emitting components 110 is in direct mechanical and thus also electrical contact with the conduction region 140. Furthermore, the light-emitting components 110 comprise a top-side contact 112 electrically conductively connected to the light-emitting semiconductor chips 120. The underside contact 111 likewise electrically conductively connects to the light-emitting semiconductor chips 120. In this example, the light-emitting components 110 comprise an emission direction oriented in the direction of a top side of the module for a video wall. In particular, the emission direction of the light-emitting components 110 faces away from the carrier 130. The thickness of the light-emitting components 110 may be 2 to 50 micrometers.

Figure 9:
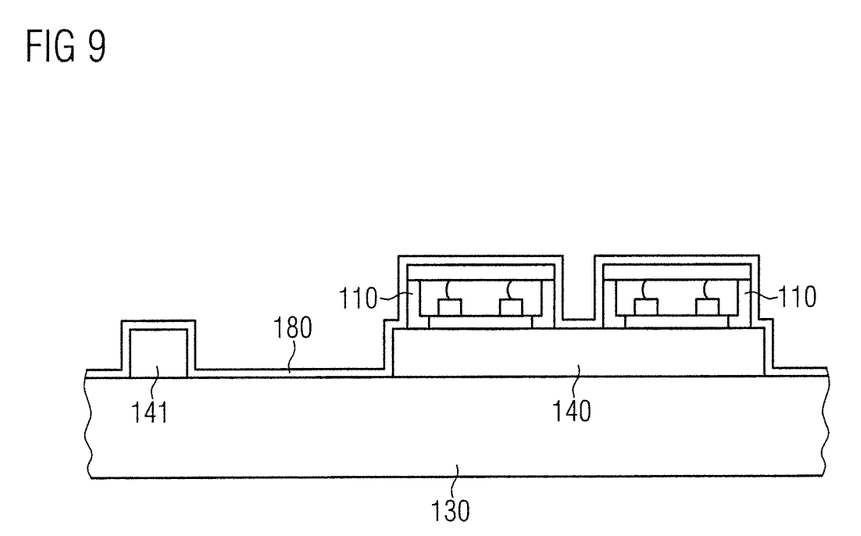

In FIG. 9, the arrangement of light-emitting components 110 on a conduction region 140 on a carrier 130 and the further conduction region 141 are covered with a dielectric 180, which acts as an insulation layer. The dielectric 180 was thus applied on the carrier with the further components. In this example, the dielectric 180 is electrically insulating. The thickness of the dielectric 180 is up to 1 micrometer. The dielectric may comprise silicon oxide, aluminum oxide, an organic material and/or some other insulator.

Figure 10:
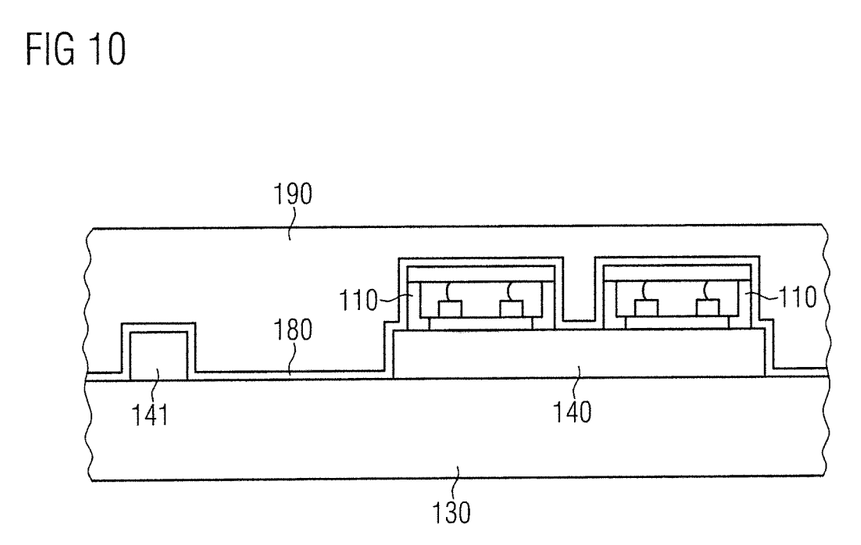

According to a further method step illustrated according to FIG. 10, a covering layer, for example, a photoresist 190, is applied on the dielectric 180. In this example, the photoresist 190 completely covers the light-emitting components 110 covered by the dielectric 180. Above the light-emitting components 110, the photoresist has a planar surface.

Figure 11:
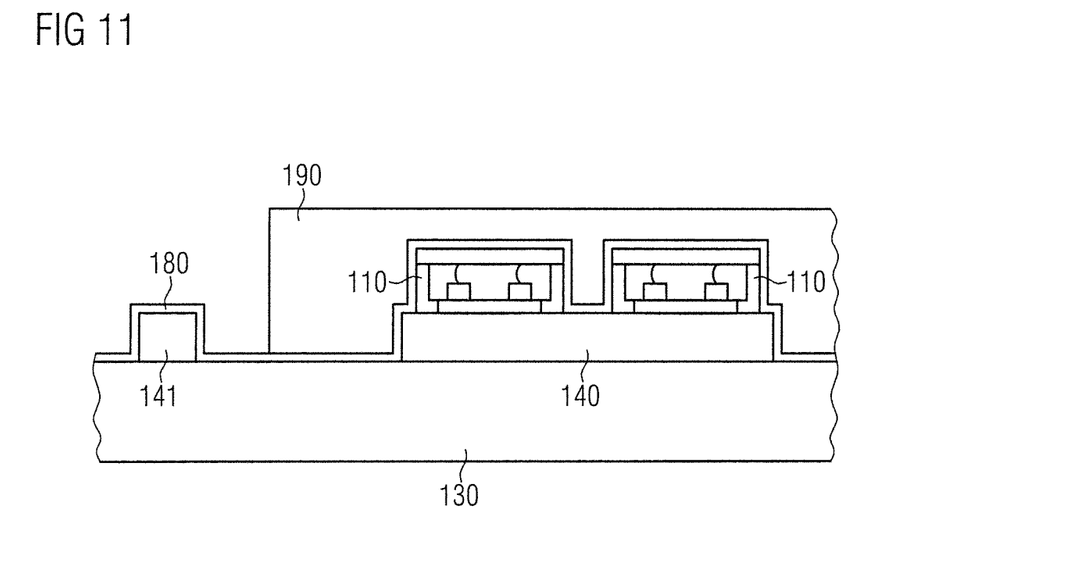

FIG. 11 illustrates a structure of the construction after an optional exposure and partial removal of the photoresist 190. In this example, the photoresist has been exposed and removed in the region of the further conduction region 141. However, this method step may also be omitted. In this example, the photoresist 190 continues to be arranged above the further conduction region 141 as in FIG. 10.

Figure 12:
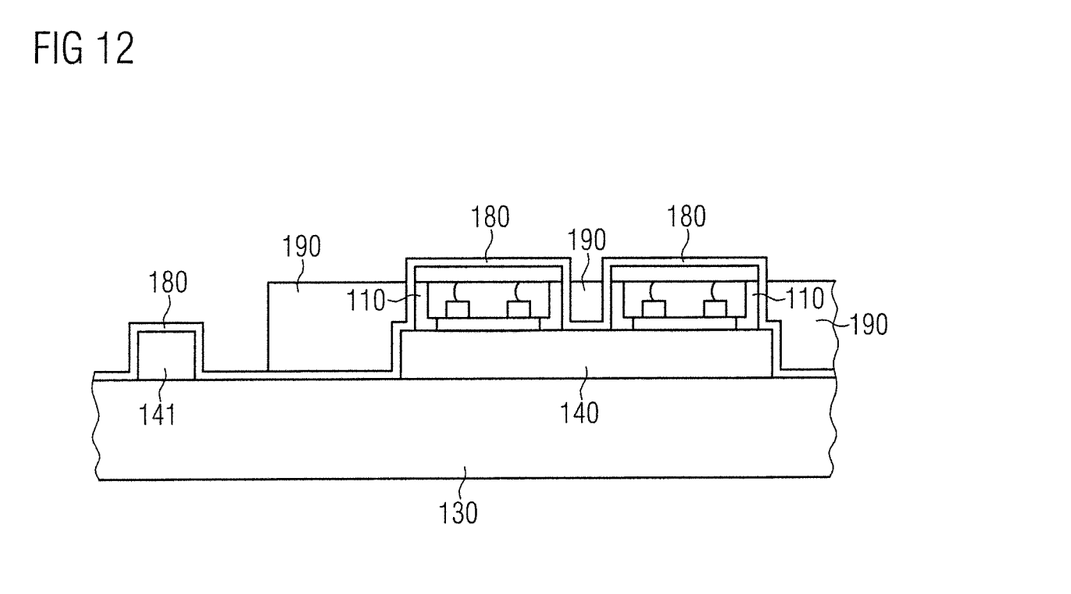

FIG. 12 shows the construction after a further method step, in which the photoresist 190 was removed, in particular anisotropically etched, from the top side of the carrier 130. A side, facing away from the carrier 130, of the light-emitting components 110 covered by the dielectric 180 is uncovered as a result.

Figure 13:
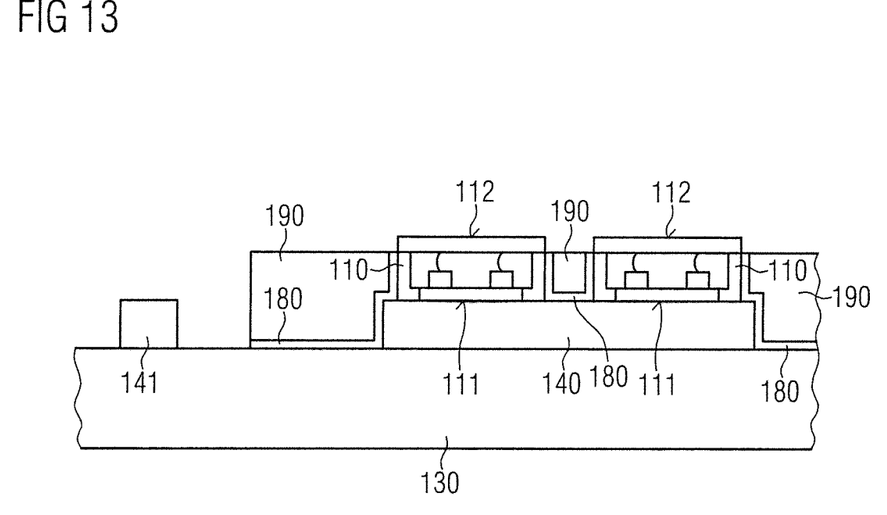

In a further method step, the dielectric 180 is etched in the uncovered regions, as a result of which the dielectric 180 no longer covers the top side of the light-emitting components 110. In particular, the dielectric 180 no longer covers the top-side contacts 112 of the light-emitting components 110.

Figure 14:
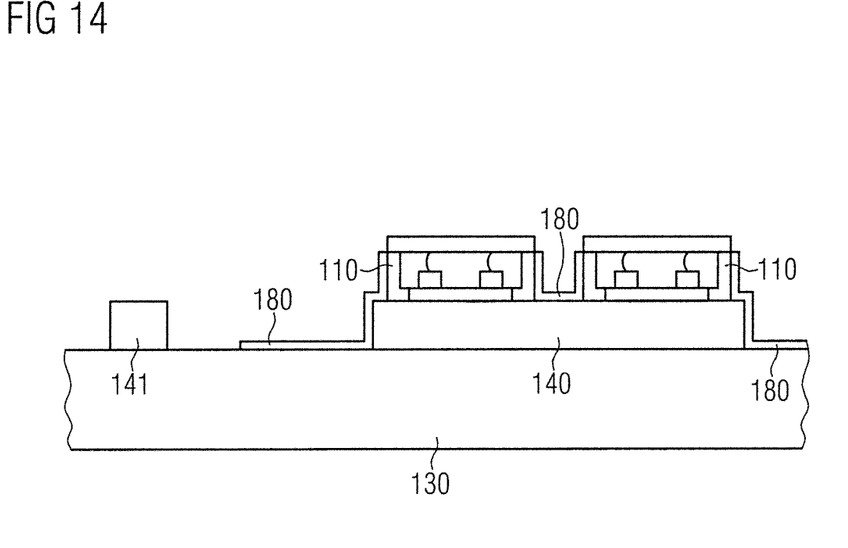

In a further method step, the result of which is illustrated in FIG. 14, the remaining photoresist 190 is removed.

Figure 15:
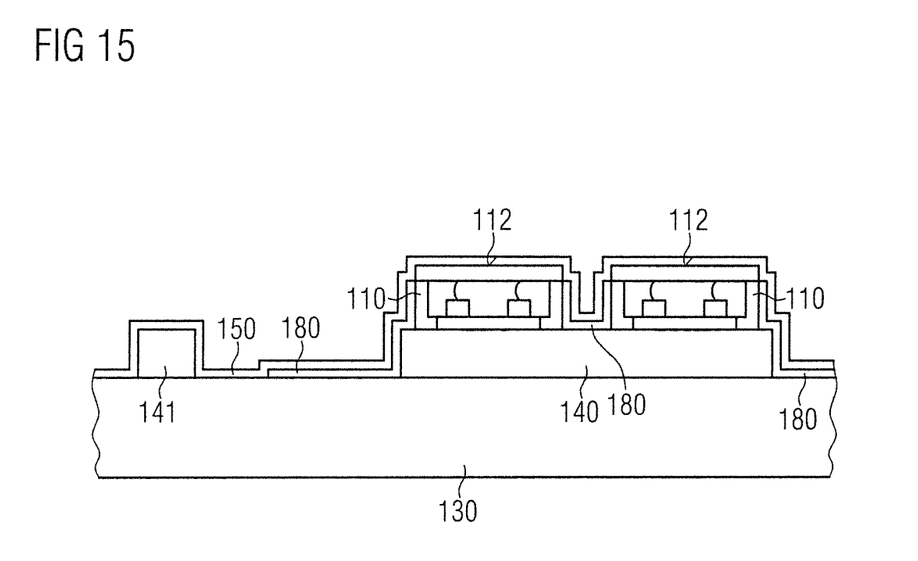

According to a further method step, the result of which is illustrated in FIG. 15, an electrically conductive layer 150 is applied on the dielectric and the uncovered regions of the light-emitting components 110, that is to say in particular the top-side contacts 112. The electrically conductive layer, as illustrated in FIG. 15, likewise electrically conductively connects to the further conduction region 141. If the method step in FIG. 11, that is to say the exposure and partial removal of the photoresist, was not carried out, the dielectric 180 may likewise be removed in a partial region of the further conduction region 141 before applying the electrically conductive layer 150 to produce an electrical contact between the further conduction region 141 and the electrically conductive layer 150.

Figure 16:
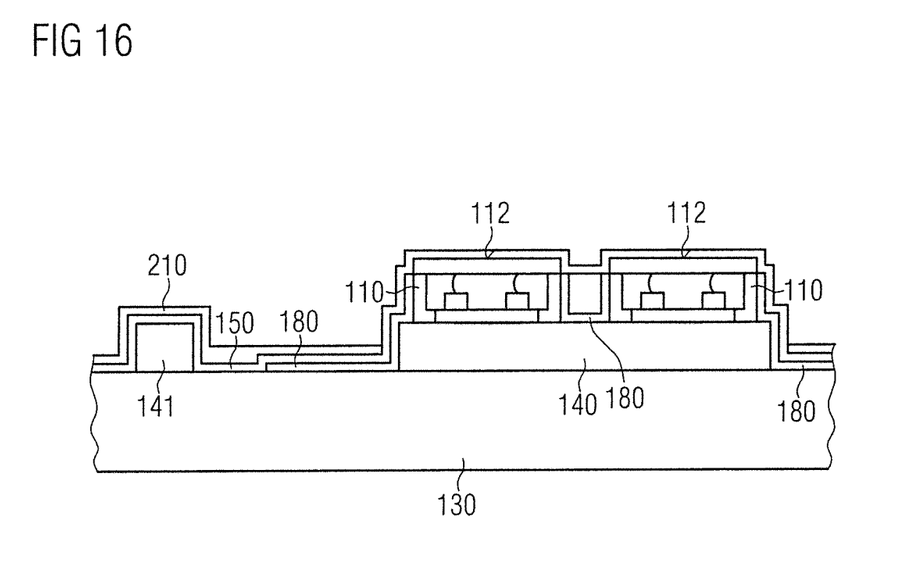
FIG. 16 schematically shows a further cross section through an excerpt from a module for a video wall.

FIG. 16 shows a cross section through a further example of an excerpt from a module 100 for a video wall, in which a partial region of a top side of the module 100 for a video wall was covered with a black layer 210. In this example, the black layer 210 is present in particular in the regions in which the light-emitting components 110 are not arranged.

The conduction region 140 may be provided with a metallic coating before the light-emitting components are positioned on the conduction regions. This is advantageous, for example, if copper conductor tracks are provided as conduction region 140 and/or further conduction region 141. By applying further metallic layers on the conduction regions 140, 141, it is possible to simplify, for example, a process of soldering on the light-emitting components 110, for example, by a silver layer. Other metals that improve the properties of the module for a video wall are also possible.

Figure 17:
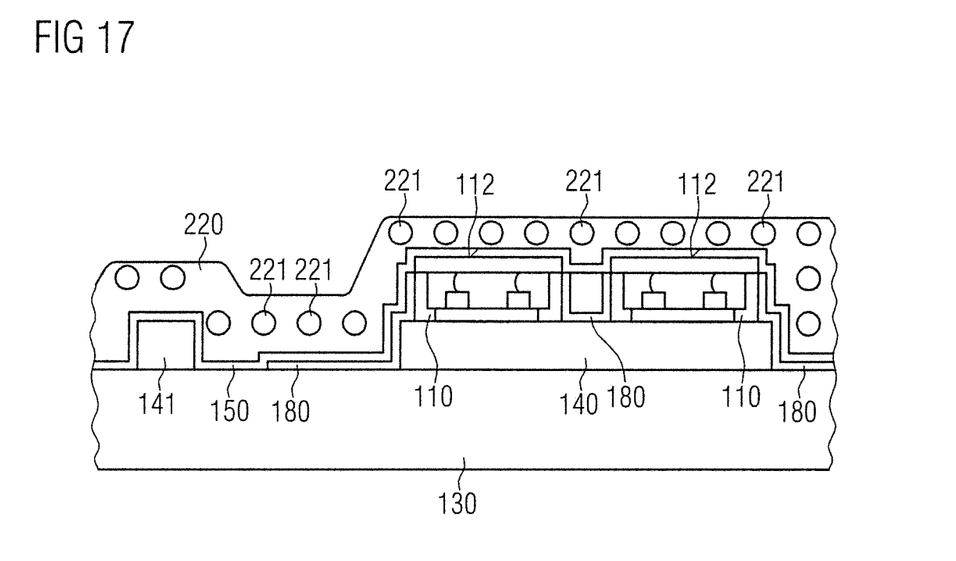
FIG. 17 schematically shows a further cross section through an excerpt from a module for a video wall.

FIG. 17 shows a further example of a cross section through a module for a video wall. A scattering layer 220 comprising scattering particles 221 is arranged above the light-emitting components 110, the electrically conductive layer 150 and the carrier 130. The optical properties of the module 100 for a video wall may be improved as a result.

The excerpts from the module for a video wall as shown in FIGS. 7 to 17 each correspond to the light-emitting components 110 of a single color of a pixel 170. Further incidences of these arrangements are located to the left and right of the conduction region 140 illustrated in FIGS. 7 to 17. Likewise, further incidences of these arrangements are located in front of and behind the arrangements illustrated in FIGS. 7 to 17 relative to the plane of the drawing.

Figure 18:
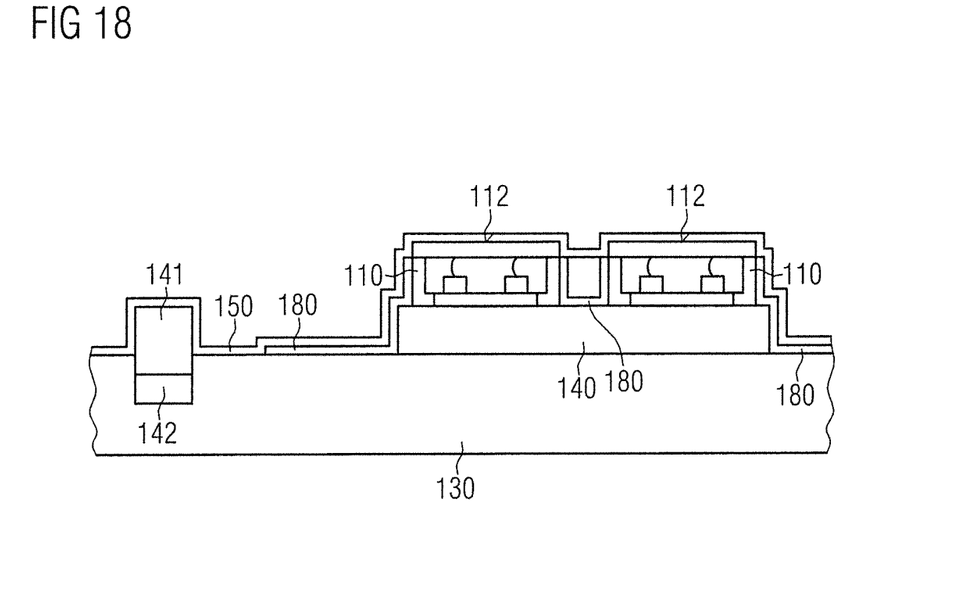
FIG. 18 schematically shows a further contacting possibility for the light-emitting components of a module for a video wall.

FIG. 18 shows a further cross section through the arrangement from FIG. 15, in which the further conduction region 141 is provided with a transverse contact 142. The transverse contact 142 may serve, for example, for the electrical contacting of the further conduction region 141 with the contacting locations 172 from FIG. 5. For this purpose, the transverse contact 142 is arranged within the carrier 130 and, outside the carrier 130, connects only to the further conduction region 141. Instead of the connection to the further conduction region 141, the transverse contact 142 may also connect to the conduction region 140 to provide overall all the contacting possibilities from FIG. 6.

If, during operation of the module 100 for a video wall, individual light-emitting semiconductor chips 120 within individual components 110 or clusters 160 of components 110 fail, this may be detected by way of the operating voltage and the operating current of the individual pixels, the driving of which is shown in FIG. 6. By virtue of the large number of light-emitting semiconductor chips 120, in particular in the use of the light-emitting components 110 in FIGS. 3 and 4, the operating voltage and operating current of the individual pixels may then be adapted such that the radiation power of the pixels once again reaches the original value, even though now one of the light-emitting semiconductor chips 120 no longer radiates light. As a result, the module 100 for a video wall may continue to be operated without losses of quality even in a defect of individual light-emitting semiconductor chips 120.

Figure 19:
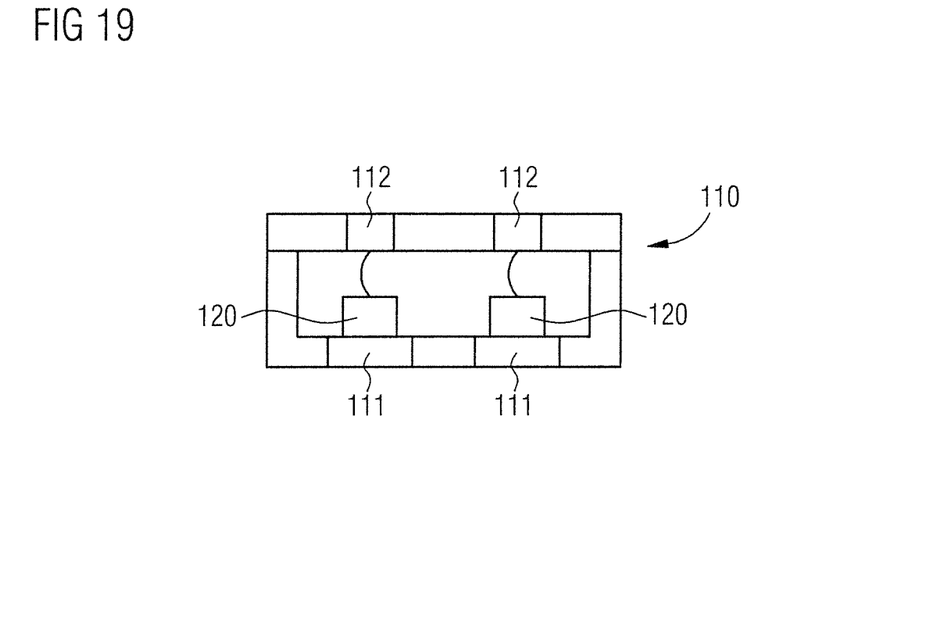
FIG. 19 schematically shows a cross section through a light-emitting component.

FIG. 19 shows a cross section through a light-emitting component 110 partly corresponding to the light-emitting component 110 from FIG. 8 and may be used in the examples in FIGS. 8 to 18. The light-emitting component 110 contains a plurality of light-emitting semiconductor chips 120. In contrast to FIGS. 8 to 18, the light-emitting component in FIG. 19 comprises an underside contact 111 and a top-side contact 112, respectively, for each of the light-emitting semiconductor chips 120. The light-emitting semiconductor chips 120 connect in parallel by contacting the underside contacts 111 and the top-side contacts 112 analogously to the method described in FIGS. 8 to 15.

Figure 20:
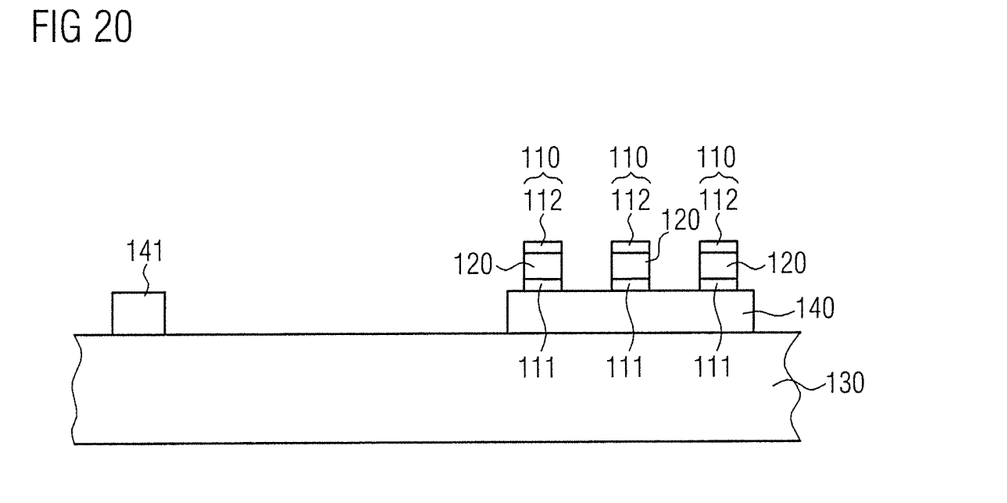
FIG. 20 schematically shows a cross section through an alternative intermediate product during the production process.

FIG. 20 shows an intermediate product of the production method for a video wall module 100 in which alternative light-emitting components 110 are used instead of the light-emitting components 110 illustrated in FIG. 8. The alternative light-emitting components 110 each comprise a light-emitting semiconductor chip 120, an underside contact 111 and a top-side contact 112. The light-emitting components 110 are arranged with the underside contact 111 on the conduction region 140. In this example, the light-emitting components 110 are positioned analogously to FIG. 8. The further production method proceeds analogously to FIGS. 9 to 15.

Although our video walls and methods have been more specifically illustrated and described in detail by preferred examples, this disclosure is not restricted by the examples disclosed and other variations may be derived therefrom by those skilled in the art, without departing from the scope of protection of the appended claims.

This application claims priority of DE 10 2016 113 168.7, the subject matter of which is incorporated herein by reference.

The invention claimed is:

1. A module for a video wall comprising:
a plurality of light-emitting components; and
a carrier comprising conduction regions,
wherein the light-emitting components each comprise a top side comprising a top-side contact and an underside comprising an underside contact,
the light-emitting components are configured to emit electromagnetic radiation via the top side,
the underside contacts of the light-emitting components electrically conductively connect to the conduction regions,
the top-side contacts electrically contact a conductive layer,
the light-emitting components each comprise at least four light-emitting semiconductor chips,
the light-emitting semiconductor chips within at least one of the light-emitting components interconnect in parallel with one another,
the light-emitting semiconductor chips within said at least one of the light-emitting components each electrically conductively connect to the top-side contact and the underside contact of said light-emitting component,
a plurality of adjacent light-emitting components constitute a cluster, wherein a plurality of clusters is arranged within the module, and
the light-emitting semiconductor chips of the light-emitting components of at least one of the clusters comprise an identical nominal wavelength.

2. The module for a video wall according to claim 1, wherein respectively two or three adjacent clusters constitute a pixel, and the light-emitting semiconductor chips of each cluster comprise a different wavelength than the light-emitting semiconductor chips of the other clusters within the pixel.

3. The module for a video wall according to claim 1, wherein the conductive layer is configured to be transparent to a light emitted by the light-emitting semiconductor chips.

4. The module for a video wall according to claim 1, wherein the light-emitting components comprise up to two thousand five hundred light-emitting semiconductor chips in a 50×50 matrix, and at least one chip position within the matrix is unoccupied.

5. The module for a video wall according to claim 1, wherein the light-emitting components comprise up to two thousand five hundred light-emitting semiconductor chips in an m×n matrix, wherein an electrical contacting of at least one light-emitting semiconductor chip of the matrix is interrupted.

6. The module for a video wall according to claim 1, wherein the light-emitting components electrically conductively connect to one another row by row via the underside contacts and the conduction region, and the light-emitting components connect to one another column by column via the top-side contacts and the conductive layer.

7. The module for a video wall according to claim 1, further comprising an insulation layer arranged between the conduction regions and the conductive layers that electrically insulates the conduction region and the conductive layers with respect to one another.

8. The module for a video wall according to claim 1, wherein scattering particles are arranged on the top side of the light-emitting components.

9. The module for a video wall according to claim 1, wherein the conductive layer is electrically conductively connected via a contacting location to an underside of the carrier facing away from the light-emitting components, and the conduction regions electrically conductively connect to the underside of the carrier by a contacting location.

10. The module for a video wall according to claim 1, wherein the light-emitting semiconductor chips within each light-emitting component interconnect in parallel with one another,
- the light-emitting semiconductor chips within each light-emitting component each electrically conductively connect to the top-side contacts and the underside contacts of said light- emitting component, and
- the light-emitting semiconductor chips of the light-emitting components of each cluster comprise an identical nominal wavelength.

11. The module for a video wall according to claim 1, wherein the light-emitting semiconductor chips are square with a side length of 4 to 6 micrometers, while the distance between the light-emitting semiconductor chips is 0 to 15 micrometers.

12. The module for a video wall according to claim 1, wherein a thickness of the light-emitting components is 2 to 50 micrometers.

13. The module for a video wall according to claim 1, wherein the light-emitting components each comprise a housing, wherein the top-side contact and the underside contact are part of the housing.

14. A module for a video wall comprising:
- a plurality of light-emitting components; and
- a carrier comprising conduction regions,
- wherein the light-emitting components each comprise a top side comprising a top-side contact and an underside comprising an underside contact,
- the light-emitting components are configured to emit electromagnetic radiation via the top side,
- the underside contacts of the light-emitting components electrically conductively connect to the conduction regions,
- the top-side contacts electrically contact a conductive layer,
- the light-emitting components each comprise at least four light-emitting semiconductor chips,
- the light-emitting semiconductor chips within at least one of the light-emitting components interconnect in parallel with one another, the light-emitting semiconductor chips within said at least one of the light-emitting components each electrically conductively connect to the top-side contact and the underside to contact of said light-emitting component,
- a plurality of groups of adjacent light-emitting components constitute clusters, and
- the light-emitting semiconductor chips of the light-emitting components of at least one of the clusters comprise an identical nominal wavelength.

15. A method of producing a module for a video wall comprising:
- providing a carrier comprising conduction regions;
- positioning light-emitting components on the conduction regions, wherein the light-emitting components comprise light-emitting semiconductor chips, and the light-emitting components comprise an emission direction, the emission direction is oriented in the direction of a top side of the module, the light-emitting components each comprise an underside contact on a side of the light-emitting component facing away from the top side of the module and a top-side contact on a side of the light-emitting component facing the top side of the module, and the underside contacts are in electrical contact with the conduction regions, wherein the light-emitting components each comprise at least four light-emitting semiconductor chips, the light-emitting semiconductor chips within at least one of the light-emitting components interconnect in parallel with one another, and the light-emitting semiconductor chips within said at least one of the light-emitting components each electrically conductively connect to the top-side contact and the underside contact of said light-emitting component;
- applying a dielectric on the top side of the module, wherein the carrier, the conduction regions and the light-emitting components are covered by the dielectric, and the dielectric comprises a smaller thickness than the height of the light-emitting components;
- applying a covering layer on the dielectric, wherein the covering layer comprises a planar surface and the light-emitting components covered by the dielectric are completely covered by the covering layer;
- anisotropically etching the covering layer such that at least one side facing away from the carrier of the light-emitting components covered by the dielectric is uncovered;
- etching the dielectric in the uncovered regions such that the top-side contacts are no longer covered by the dielectric;
- removing the covering layer; and
- applying a conductive layer on the top-side contacts of the light-emitting components,
- such that a plurality of adjacent light-emitting components constitute a cluster and such that a plurality of clusters is arranged within the module, and
- the light-emitting semiconductor chips of the light-emitting components of at least one of the clusters comprise an identical nominal wavelength.

16. The method according to claim 15, wherein the conduction regions are provided with a metallic coating before the light-emitting components are positioned on the conduction regions.

17. The method according to claim 15, wherein the top side of the module outside the light-emitting components is covered with a black layer.

18. The method according to claim 15, wherein a scattering layer is applied on the top side of the module for a video wall.

19. A method of operating the module for a video wall according to claim 1, wherein a voltage and/or a current intensity of light-emitting components and/or of pixels are/is measured, the measured voltage and/or current intensity of the light-emitting components and/or pixels are/is taken as a basis to detect whether light-emitting semiconductor chips comprise defects, and the voltage and/or the current intensity of the light-emitting components and/or of the pixels are/is adapted in an identified defect to generate a desired light power.

* * * * *